(12) United States Patent
Sueyoshi et al.

(10) Patent No.: US 6,740,834 B2
(45) Date of Patent: May 25, 2004

(54) VEHICLE DOOR HANDLE SYSTEM

(75) Inventors: Masahiko Sueyoshi, Miyazaki (JP); Hiroto Fujiwara, Miyazaki (JP); Suguru Asakura, Saitama (JP); Naoto Yamamoto, Saitama (JP); Toru Namiki, Saitama (JP)

(73) Assignees: Kabushiki Kaisha Honda Lock, Miyazaki (JP); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/295,029

(22) Filed: Nov. 15, 2002

(65) Prior Publication Data

US 2003/0122556 A1 Jul. 3, 2003

(30) Foreign Application Priority Data

Nov. 20, 2001 (JP) .......................... 2001-354611
Jul. 31, 2002 (JP) .......................... 2002-223855

(51) Int. Cl.⁷ .............................................. H01H 9/00
(52) U.S. Cl. ................. 200/600; 200/61.85; 200/61.93; 200/293.1
(58) Field of Search .......................... 70/237, 255, 258; 180/287; 200/600, 5 R, 61.58 R, 61.85, 61.93, 293.1; 307/9.1, 10 R, 10.1, 10.2; 340/825.31, 825.34, 825.69, 522, 426, 539, 573.1

(56) References Cited

U.S. PATENT DOCUMENTS

| | | | | |
|---|---|---|---|---|
| 3,703,217 A | * | 11/1972 | Kulick et al. ............... | 180/272 |
| 4,868,544 A | * | 9/1989 | Havens ..................... | 340/568.5 |
| 5,583,386 A | * | 12/1996 | Meixner et al. ............ | 307/326 |
| 6,034,617 A | * | 3/2000 | Luebke et al. ............. | 340/5.62 |
| 6,431,643 B2 | * | 8/2002 | Grey ......................... | 296/214 |
| 6,577,228 B1 | * | 6/2003 | Tsuchida et al. ........... | 340/5.72 |

FOREIGN PATENT DOCUMENTS

JP  7-189538  7/1995  ........... E05B/49/00

* cited by examiner

Primary Examiner—Michael A. Friedhofer
(74) Attorney, Agent, or Firm—Arent Fox Kintner Plotkin & Kahn

(57) ABSTRACT

A vehicle door handle system includes a pair of electrodes disposed within an operating handle located on the outer surface side of a door along the longitudinal direction of the vehicle. A detection circuit for detecting a change in capacitance between the two electrodes is connected to the two electrodes.

17 Claims, 20 Drawing Sheets

10 # VEHICLE DOOR HANDLE SYSTEM

BACKGROUND OF THE INVENTION

1. Field of the Invention

The present invention relates to a vehicle door handle system, and in particular, to a vehicle door handle system that enables a vehicle user's intention to unlock or lock the door to be recognized in a vehicle smart entry system.

2. Related Art

Conventionally, an arrangement for recognizing a vehicle user's intention to unlock a door is known from, for example, Japanese Patent Application Laid-open No. 7-189538 wherein a capacitance sensor formed from two parallel sensor wires is disposed within a door handle. A vehicle user's intention to unlock the door is recognized by a change in capacitance when, for example, the vehicle user's hand approaches the door handle.

In such a conventional arrangement, there is a possibility that the door might be unintentionally unlocked simply when the vehicle user is near the door handle. In order to avoid deterioration in such a theft prevention feature, it is desirable to accurately recognize the vehicle user's intention to unlock the vehicle door.

SUMMARY OF THE INVENTION

It is an object of the present invention to overcome the above-described drawbacks of the conventional arrangement.

It is also an object of the present invention to provide a vehicle door handle system that accurately recognizes a vehicle user's intention to unlock or lock the vehicle door.

In order to achieve the above-described objects, in accordance with a first aspect of the present invention, a vehicle door handle system includes a pair of electrodes disposed within an operating handle located on the outer surface side of a door along the longitudinal direction of the vehicle. A detection circuit is connected to the two electrodes and detects a change in capacitance therebetween.

In accordance with this arrangement, since the detection circuit detects a change in capacitance between the pair of electrodes when a vehicle user touches the operating handle, the vehicle user's intention to unlock or lock the door is accurately recognized.

Furthermore, in accordance with a second aspect of the present invention, a vehicle door handle system includes an operating handle having a handle main body and a cover that covers the outer side of the handle main body. The handle main body and cover are each manufactured from a synthetic resin. A metal frame is fixedly housed between the handle main body and the cover. A detection circuit is installed within the frame. In accordance with this arrangement, the detection circuit is protected by installing it within the metal frame, which is a strength maintaining member for the operating handle.

In accordance with a third aspect of the present invention, the metal frame is one of the electrodes and the other electrode is covered with an insulating coating and affixed to the frame. In accordance with this arrangement, since the frame is used as one of the electrodes, the number of parts is reduced and, moreover, the other electrode can easily be installed.

In accordance with a fourth aspect of the present invention, a vehicle door handle system includes an operating handle having a handle main body and a cover that covers the outer side of the handle main body. The handle main body and cover are each manufactured from a synthetic resin. A pair of electrodes and a base plate are also provided, with the detection circuit being fixedly housed within a recess formed in the handle main body so that the two electrodes are covered with the base plate. The interior of the recess is filled with a potting material so as to embed the two electrodes and the base plate. In accordance with this arrangement, the base plate provided with the detection circuit and the pair of electrodes are easily assembled within the operating handle, and moreover, the water resistance of the base plate and the two electrodes is enhanced.

In accordance with a fifth aspect of the present invention, a vehicle door handle system includes a rigid metal ground plate that is fixed to the handle main body so as to cover the recess and is disposed between the cover and the handle main body. In accordance with this arrangement, no change in capacitance between the two electrodes is detected by the detection circuit as a result of merely touching the surface of the cover, which prevents malfunction and tampering and, moreover, the rigidity of the operating handle is enhanced by the ground plate.

In accordance with a sixth aspect of the present invention, the pair of electrodes, which are formed into the shape of a flat plate, are integrally covered with an insulator. In accordance with this arrangement, the pair of electrodes are easily handled as a compact unit.

In accordance with a seventh aspect of the present invention, a vehicle door handle system includes an operating handle having a handle main body and a cover that covers the outer side of the handle main body. The handle main body and cover are each manufactured from a synthetic resin. A rigid metal ground plate is disposed between the cover and the handle main body and is fixed to the handle main body so as to cover the two electrodes from the cover side. In accordance with this arrangement, no change in capacitance between the two electrodes is detected by the detection circuit as a result of merely touching the surface of the cover, thereby preventing malfunction and tampering and, moreover, the rigidity of the operating handle is enhanced by the ground plate.

Modes for carrying out the present invention are explained below by reference to embodiments of the present invention illustrated in the attached drawings.

DESCRIPTION OF PREFERRED EMBODIMENTS

Figure 1:
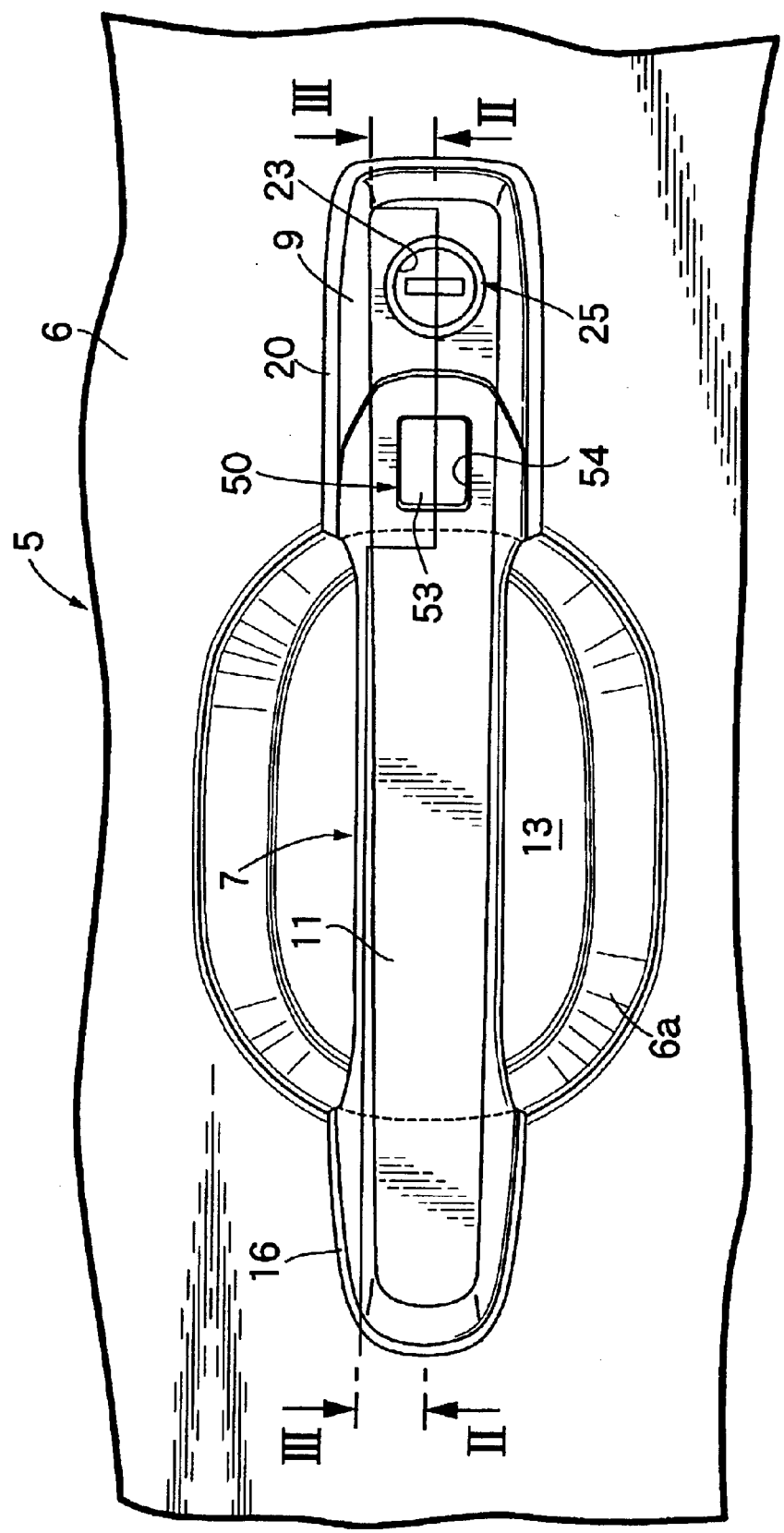
FIG. 1 is a side view of one part of a vehicle door.
Figure 2:
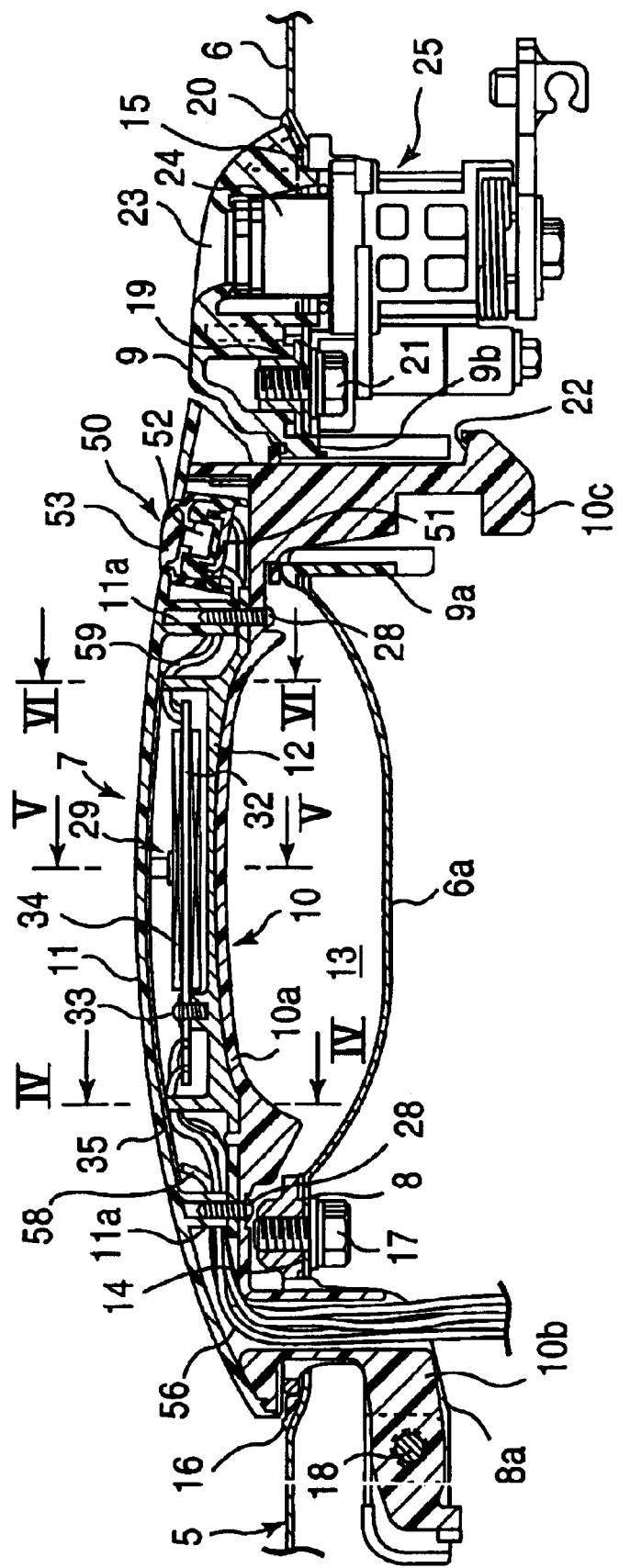
FIG. 2 is a cross section along line II—II in FIG. 1.
Figure 3:
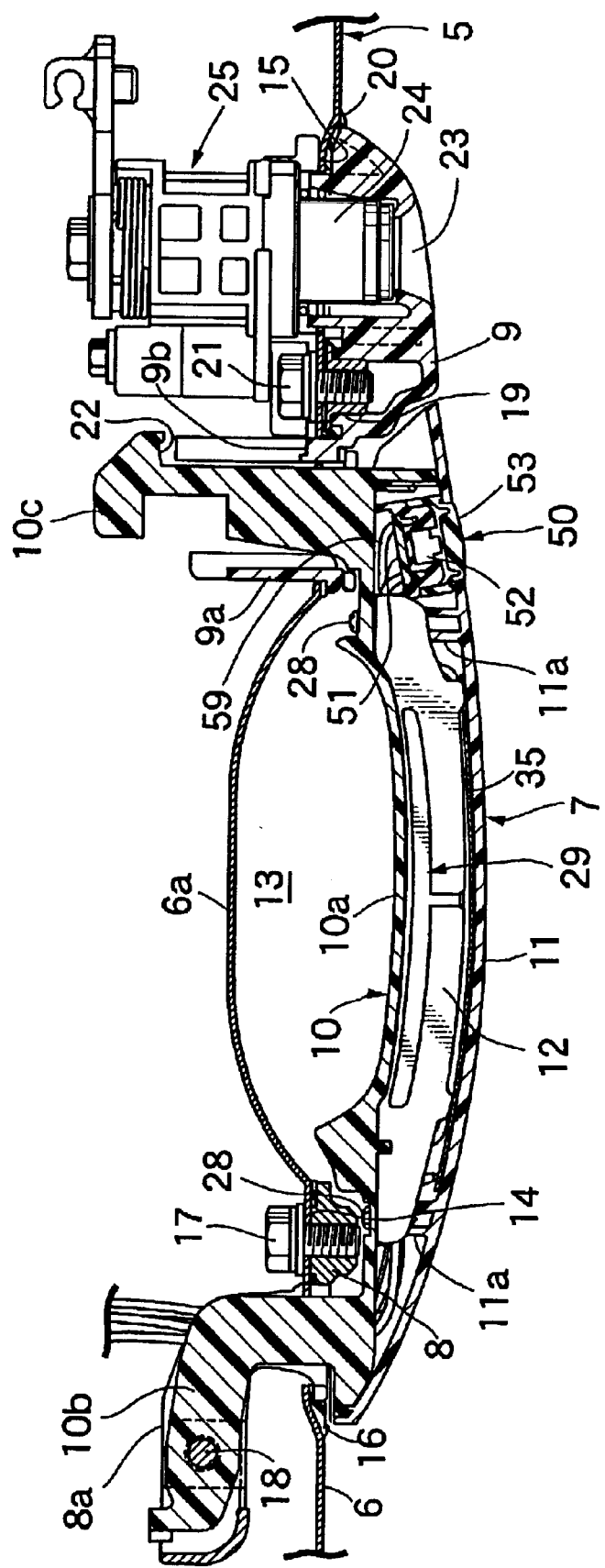
FIG. 3 is a cross section along line III—III in FIG. 1.

FIGS. 1 to 3 illustrate an outer panel 6 of a side door 5 of, for example, a passenger vehicle, that is equipped with an outer handle system having an operating handle 7, a first base member 8, and a second base member 9. The operating handle 7 extends in the longitudinal direction of the vehicle (i.e., the left to right direction in FIGS. 1 and 2), the first base member 8 is mounted on the outer panel 6 at one end of the operating handle 7, and the second base member 9 is mounted on the outer panel 6 at the other end of the operating handle 7.

The operating handle 7 includes a handle main body 10 made of a synthetic resin, a cover 11 made of a synthetic resin, and a frame 12 made of a conductive metal that is fixedly housed between the operating handle 7a and the cover 11. The handle main body 10 extends in the longitudinal direction of the vehicle, and the cover 11 covers the outer side of the handle main body 10.

The handle main body 10 integrally includes a grip section 10a, a support arm section 10b, and a guide arm section 10c. The grip section 10a has a substantially U-shaped cross section opening upward and extends in the longitudinal direction of the vehicle. The support arm section 10b is integrally provided at one end of the grip section 10a, and the guide arm section 10c is integrally provided at the other end thereof.

Provided in the outer panel 6 is a curved section 6a that protrudes inwardly to form a recess 13 that allows for the hand of a user to be inserted between the grip part 10a and the outer panel 6. Also provided in the outer panel 6 are first and second mounting seats 14 and 15 at positions on opposite sides of the curved section 6a in the longitudinal direction of the vehicle. The first and second mounting seats 14 and 15 are slightly recessed and correspond to opposite ends of the operating handle 7.

The first base member 8 and the first mounting seat 14, with a first sheet member 16 made of a synthetic resin disposed therebetween, are tightened together by a bolt 17. The first base member 8 is integrally provided with a handle support section 8a that passes through the first sheet member 16 and the outer panel 6 and is inserted into the outer panel 6. The support arm section 10b at the one end of the operating handle 7 passes through the first base member 8, the first sheet member 16, and the outer panel 6 and is inserted into the outer panel 6. The support arm section 10b is swingably supported by the handle support section 8a via a support pin 18. That is, the one end of the operating handle 7 is swingably supported in the outer panel 6 via the first base member 8.

A cylindrical boss 19 is mold-bonded to the second base member 9, which is made of a synthetic resin. The second base member 9 and the second mounting seat 15, with a second sheet member 20 made of a synthetic resin disposed therebetween, are tightened by a bolt 21 that is screwed into the boss 19. The second base member 9 is integrally provided with a guide tube 9a that passes through the outer panel 6 and projects into the outer panel 6. The guide arm section 10c at the other end of the operating handle 7 is movably inserted through the guide tube 9a. Provided on the extremity of the guide arm section 10c is a stopper 22 that abuts against and engages a restricting surface 9b provided in the guide tube 9a. The extreme movement of the guide arm section 10c in the outer direction of the guide tube 9a is thus restricted, that is, the swing of the operating handle 7 on the side toward which it moves for the opening operation is restricted.

The second base member 9 is provided with a mounting hole 23. Mounted on the outer panel 6 from the inside is a key cylinder lock 25 having one end of a cylinder body 24 facing the mounting hole 23.

Figure 4:
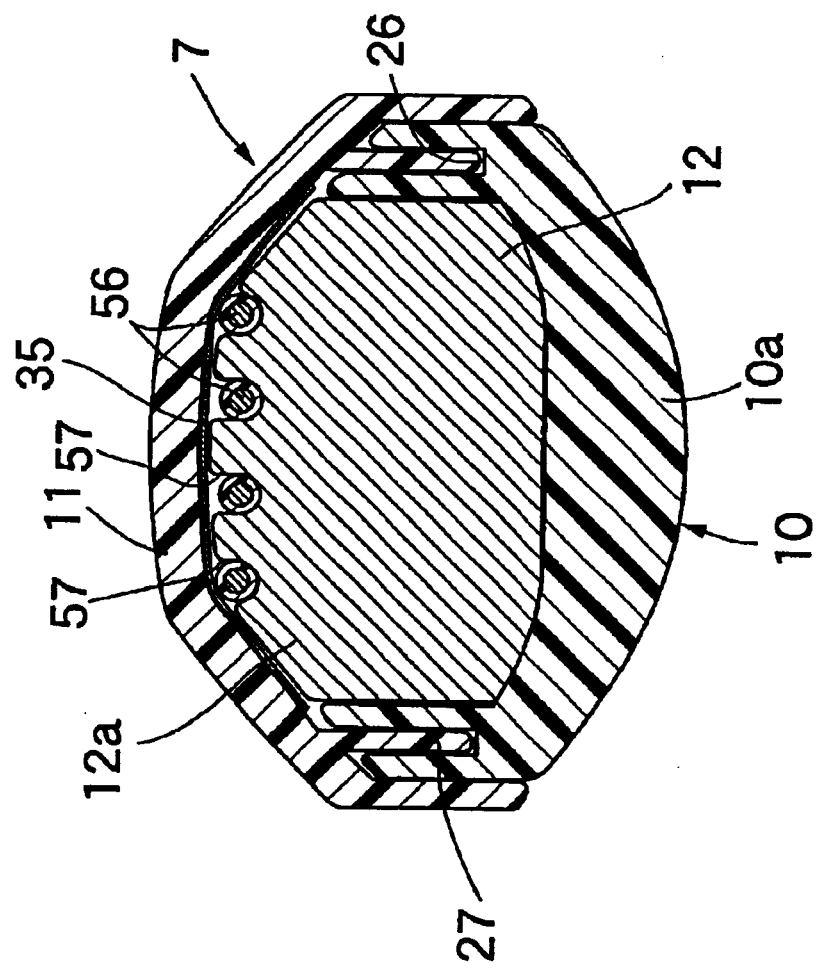
FIG. 4 is a magnified cross section along line IV—IV in FIG. 2.
Figure 5:
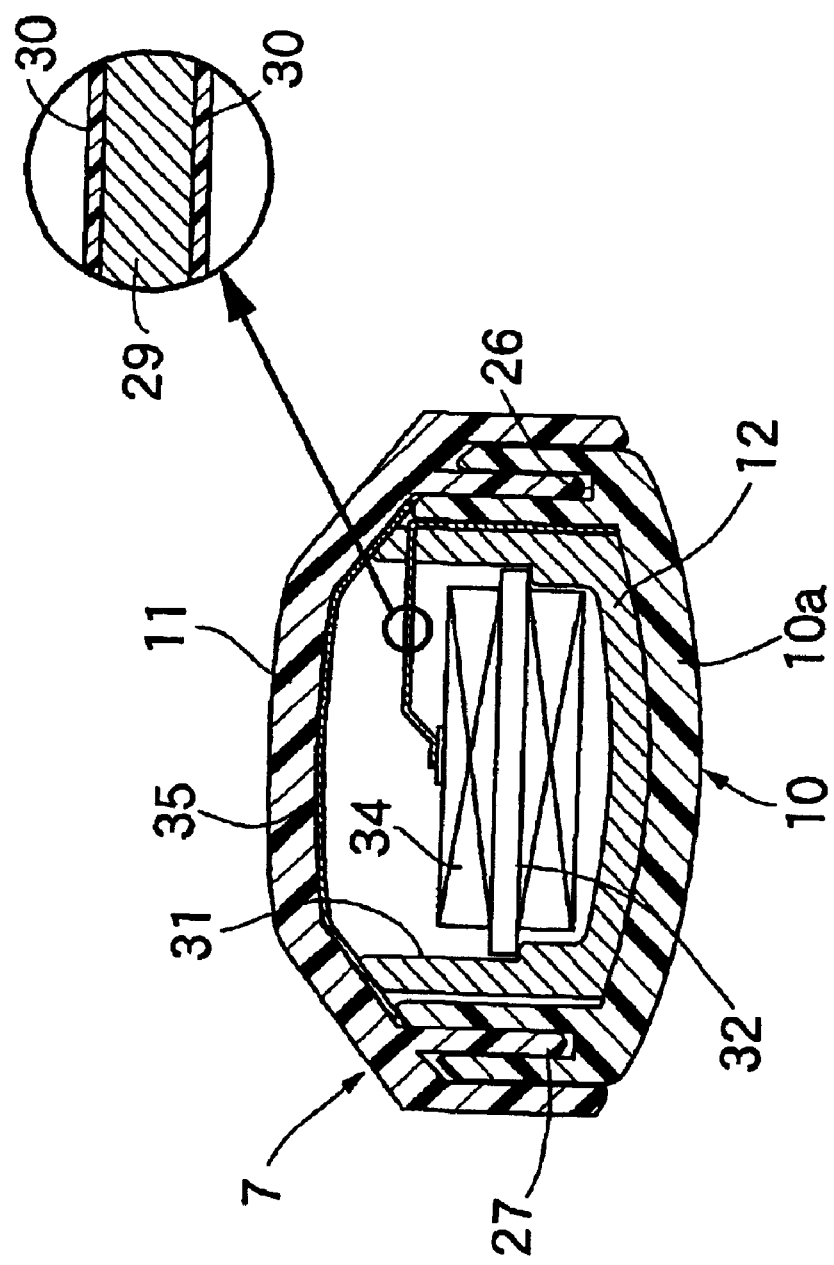
FIG. 5 is a magnified cross section along line V—V in FIG. 2.
Figure 6:
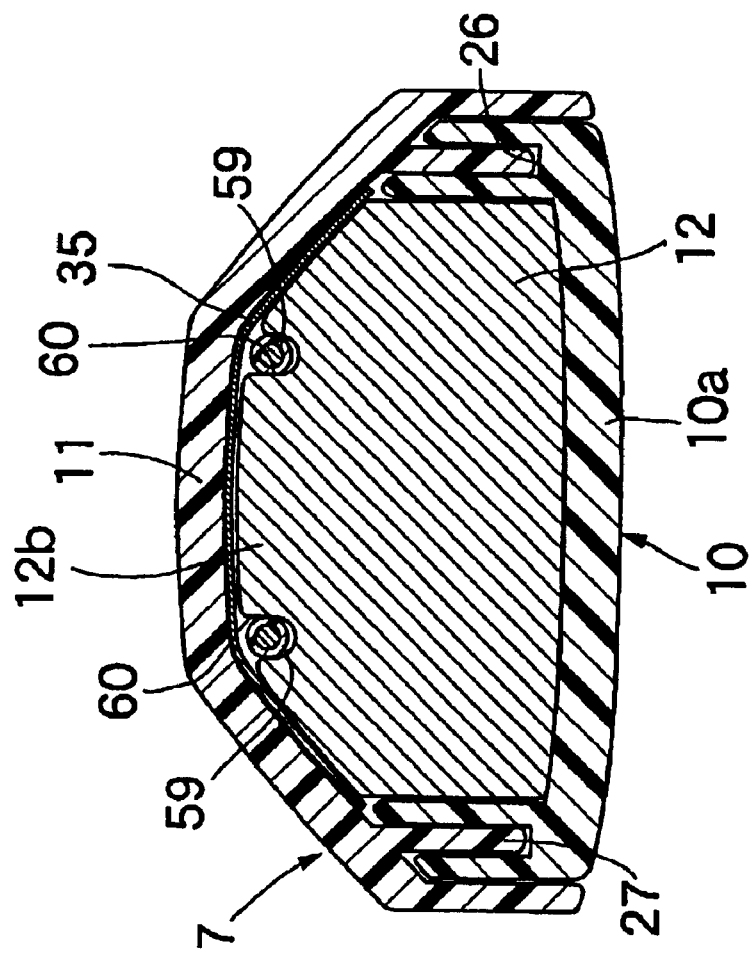
FIG. 6 is a magnified cross section along line VI—VI in FIG. 2.

Referring to FIGS. 4 to 6, the grip section 10a of the handle main body 10 of the operating handle 7 is provided with a groove 26 that extends around the entire periphery of the grip section 10a. A projection 27 that mates with the groove 26 is provided around the entire periphery of the cover 11, which has a substantially U-shaped cross section opening downward so that the entire inner peripheral surface of the cover 11 overlaps the entire outer peripheral surface of the grip section 10a.

Figure 7:
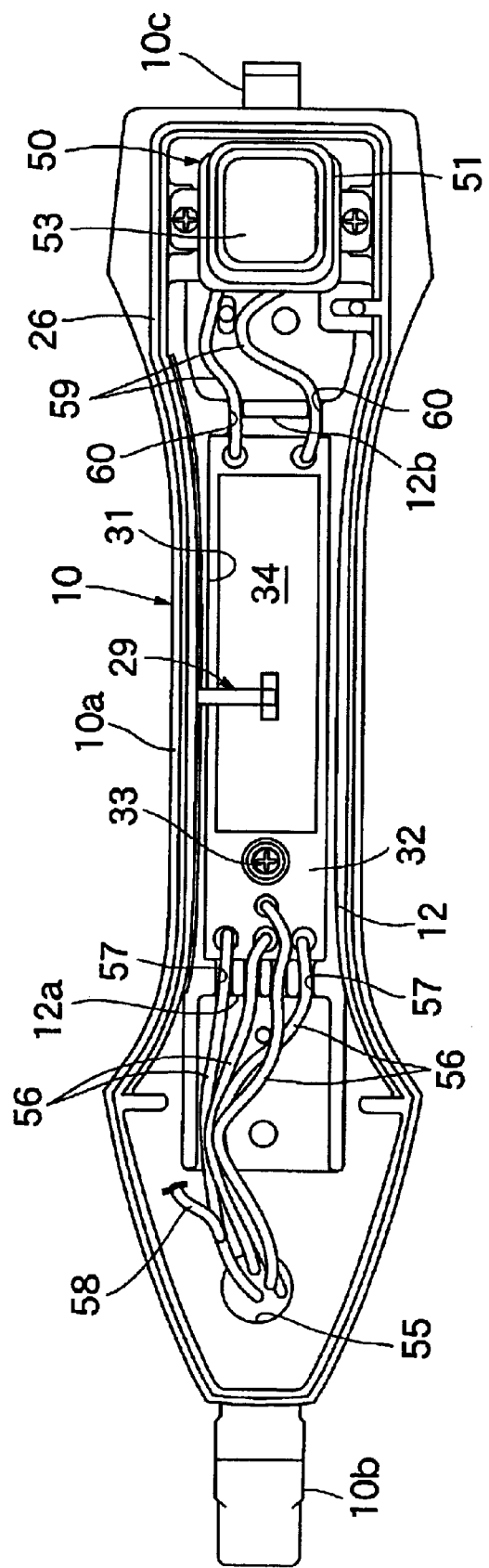
FIG. 7 is a plan view showing the interior of an operating handle with its cover removed.

Referring to FIG. 7, the cover 11 and the grip section 10a of the handle main body 10 are configured to have narrow middle sections relative to the longitudinal direction of the vehicle so the operating handle 7 is easily gripped. The frame 12, which has an external shape corresponding to the internal shape of the middle section of the grip section 10a, is housed between the grip section 10a and the cover 11.

Cylindrical bosses 11a are integrally provided on the cover 11 near the support arm section 10b and the guide arm section 10c so the frame 12 can be interposed between the bosses 11a and the grip section 10a. Screws 28 are inserted through the grip section 10a and the frame 12 from the outer panel 6 side and screwed into the bosses 11a, thereby joining the grip section 10a of the handle main body 10, the cover 11 covering the grip section 10a, and the frame 12 housed between the grip section 10a and the cover 11.

The frame 12, which is configured to have a substantially U-shaped cross section opening upward, performs as a strength maintaining member for the operating handle 7 as well as an electrode. In order to recognize the user of the vehicle intends to unlock the door, an electrode 29 that forms a pair of electrodes with the frame 12, which is an electrode, is affixed to a side face of the frame 12 within the operating handle 7. Moreover, as clearly shown in FIG. 5, the electrode 29 is covered with an insulating coating 30 made of a synthetic resin and is affixed to the frame 12 in a state in which the electrode 29 is electrically insulated from the frame 12.

A pair of partitions 12a, 12b are provided on the frame 12. The partitions 12a, 12b are spaced in the longitudinal direction of the frame 12, that is, the longitudinal direction of the vehicle. A base plate-housing recess 31 opening upward is formed in the frame 12 between the two partitions 12a, 12b. A base plate 32 is housed within the base plate-housing recess 31 and secured to the frame 12 by a screw 33.

Provided on the base plate 32 is a detection circuit 34 for detecting a change in capacitance between the electrode 29 and the frame 12 which serves as an electrode. The detection circuit 34 is installed within the frame 12. The frame 12 and the electrode 29 are connected to the detection circuit 34. An electrostatic shield plate 35 is housed within the grip section 10a outside the frame 12 so as to cover the frame 12 and the electrode 29 from the outside.

Figure 8:
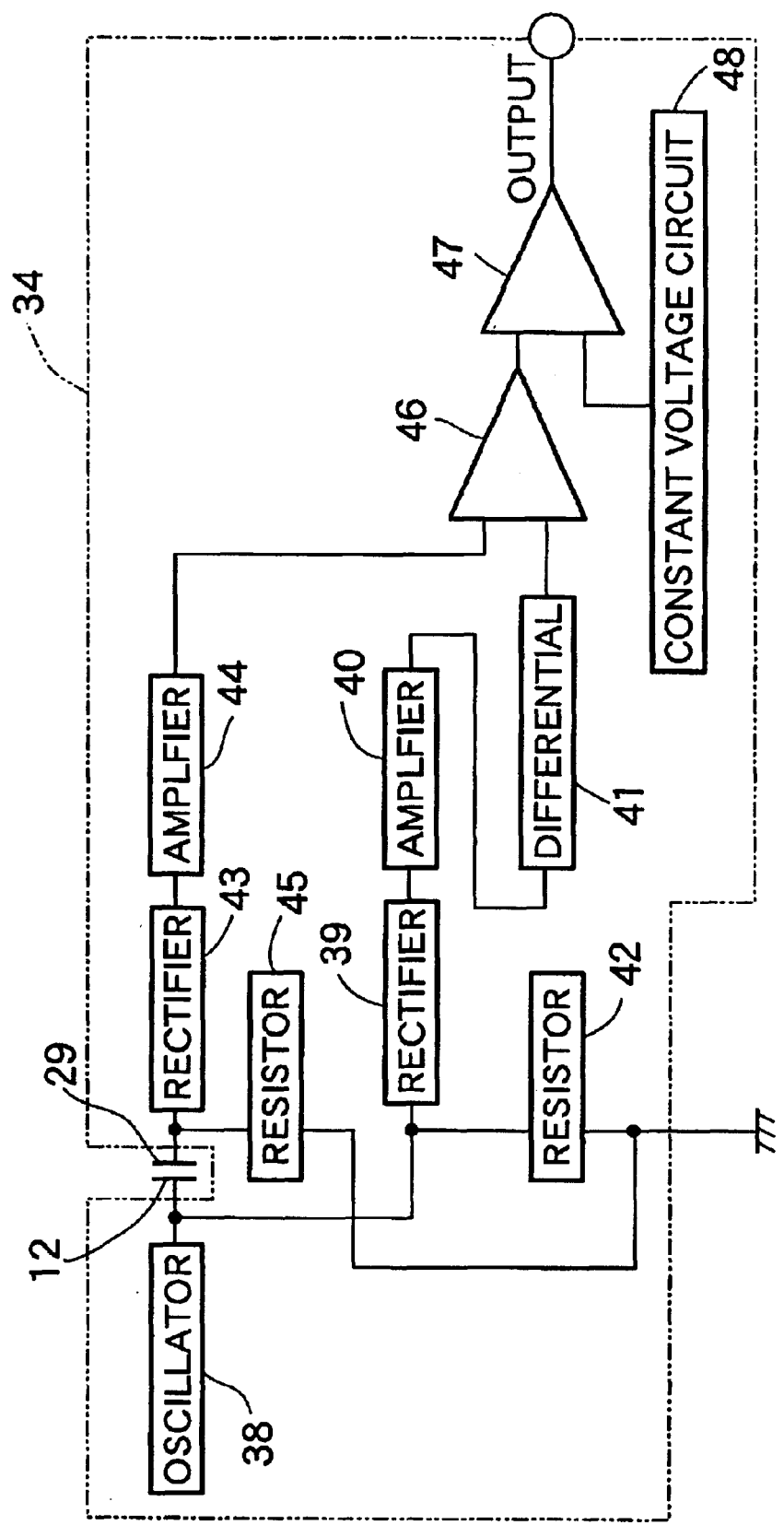
FIG. 8 is a circuit diagram showing the arrangement of a detection circuit.

In FIG. 8, the detection circuit 34 includes an oscillator 38 connected to the frame 12, a rectifier 39 connected to the junction between the frame 12 and the oscillator 38, an amplifier 40 connected in series with the rectifier 39, a differential circuit 41 connected in series with the amplifier 40, a resistor 42 provided between the frame 12 and ground, a rectifier 43 connected to the electrode 29, an amplifier 44 connected in series with the rectifier 43, a resistor 45 provided between the electrode 29 and ground, a differential amplifier 46 to which outputs from the differential circuit 41 and the amplifier 44 are input in parallel, a comparator 47 in which the output from the differential amplifier 46 input into one of its input terminals, and a constant voltage circuit 48 connected to the other input terminal of the comparator 47. The comparator 47 outputs a high level signal when the capacitance between the frame 12 and the electrode 29 exceeds a predetermined value.

Intention-to-lock recognition means 50 for recognizing the user of a vehicle intends to lock the door is disposed in the grip section 10a of the handle main body 10 of the operating handle 7 at a position displaced toward the second base member 9 from the position where the frame 12 is disposed.

The intention-to-lock recognition means 50 includes a switch holder 51 fixed to the grip section 10a, a tactile switch 52 held by the switch holder 51, and a push button 53 made of an elastomer and mounted on the switch holder 51 so as to be in contact with the tactile switch 52. The push button 53 is positioned to face an opening 54 provided in the cover 11.

In the intention-to-lock recognition means 50, when a vehicle user touches and applies a slight pushing force to the outer surface of the push button 53, the tactile switch 52 changes a switching mode to recognize a user's intention to lock the door.

A conductor lead-in hole 55 is provided in the support arm section 10b of the handle main body 10. A plurality, such as, for example four, of conductors 56 fed into the operating handle 7 via the conductor lead-in hole 55 are held by a corresponding number of holding grooves 57 provided in the partition 12a of the frame 12, and are connected to conductive areas of the base plate 32 by soldering. Furthermore, a conductor 58 extending from one of conductors 56 is connected to the electrostatic shield plate 35. A pair of conductors 59 provide a connection between the base plate 32 and the tactile switch 52 of the intention-to-lock recognition means 50 and are held by holding grooves 60 provided in the partition 12b of the frame 12.

The operation of the invention is now explained. The frame 12, which functions as an electrode, and the electrode 29 are disposed within the operating handle 7 placed on the outer surface of the door 5 so as to extend in the longitudinal direction of the vehicle. The detection circuit 34, which detects a change in capacitance between the frame 12 and the electrode 29, is connected to the frame 12 and the electrode 29. Therefore, when a vehicle user touches the operating handle 7 intending to unlock the door 5, the capacitance between the frame 12 and the electrode 29 changes. Accordingly, the change in capacitance is detected by the detection circuit 34, thereby accurately recognizing the vehicle user's intention to unlock the door.

Furthermore, the operating handle 7 includes the handle main body 10 made of a synthetic resin, the cover 11 made of a synthetic resin and covering the outside of the handle main body 10, and the metal frame 12 fixedly housed between the handle main body 10 and the cover 11. The detection circuit 34 is installed within the frame 12. Therefore, the detection circuit 34 is protected by the frame 12, which is a strength maintaining member of the operating handle 7.

Moreover, since the electrode 29 covered by the insulating coating 30 is affixed to the frame 12, which is an electrode, using the frame 12 as one of the electrodes reduces the number of parts, simplifies the overall structure, and facilitates the simple mounting of the other electrode 29.

FIGS. 9 to 20 illustrate another embodiment of the present invention.

Figure 9:
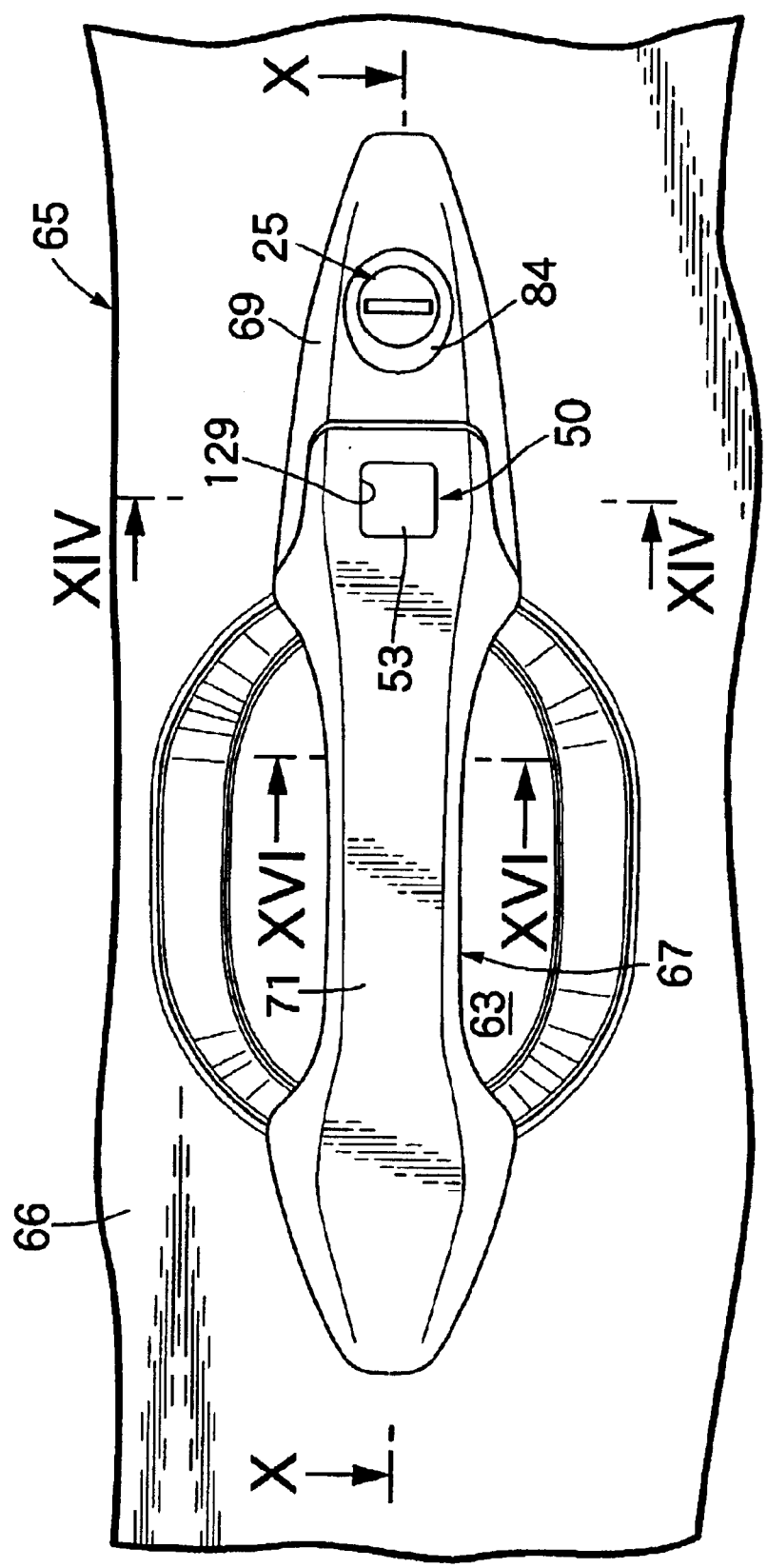
FIG. 9 is a side view of one part of a vehicle door.
Figure 10:
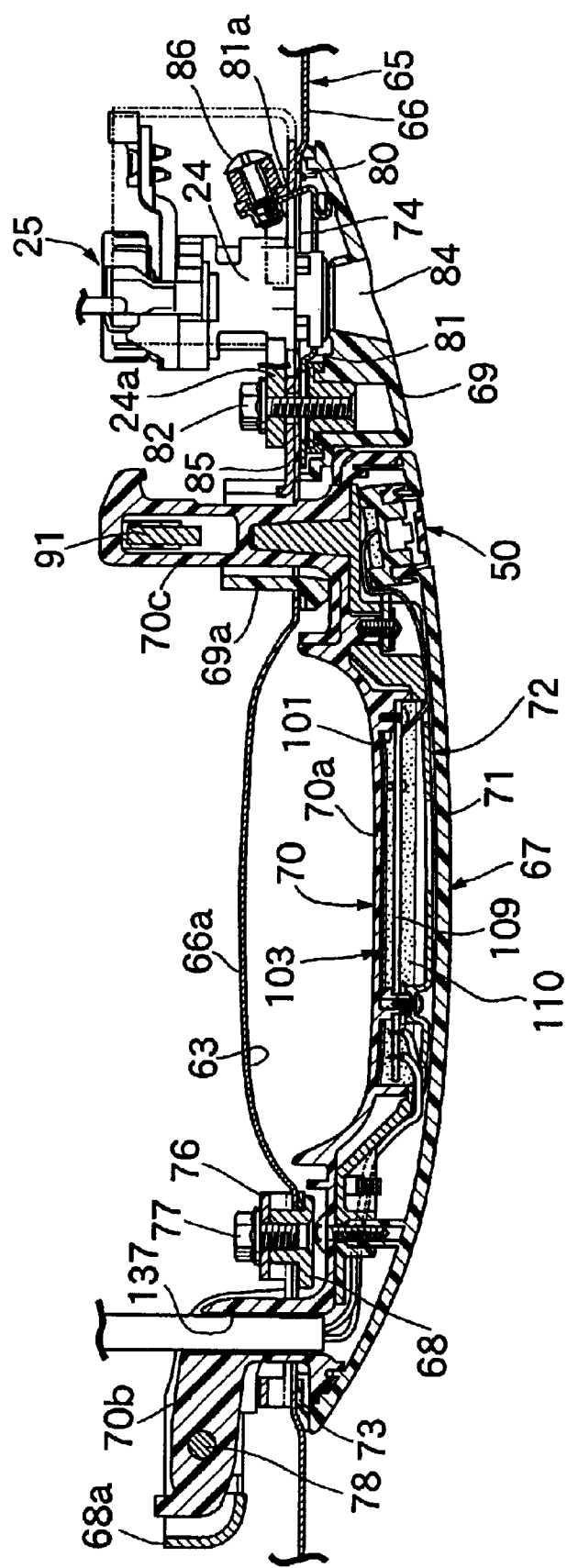
FIG. 10 is a cross section along line X—X in FIG. 9.

FIGS. 9 and 10 illustrate an outer panel 66 of a side door 65 of, for example, a passenger vehicle, that is equipped with an outer handle system having an operating handle 67, a first base member 68, and a second base member 69. The operating handle 67 extends in the longitudinal direction of the vehicle (i.e., the left to right direction in FIGS. 9 and 10), the first base member 68 is mounted on the outer panel 66 at one end of the operating handle 67, and the second base member 69 is mounted on the outer panel 66 at the other end of the operating handle 67.

Figure 11:
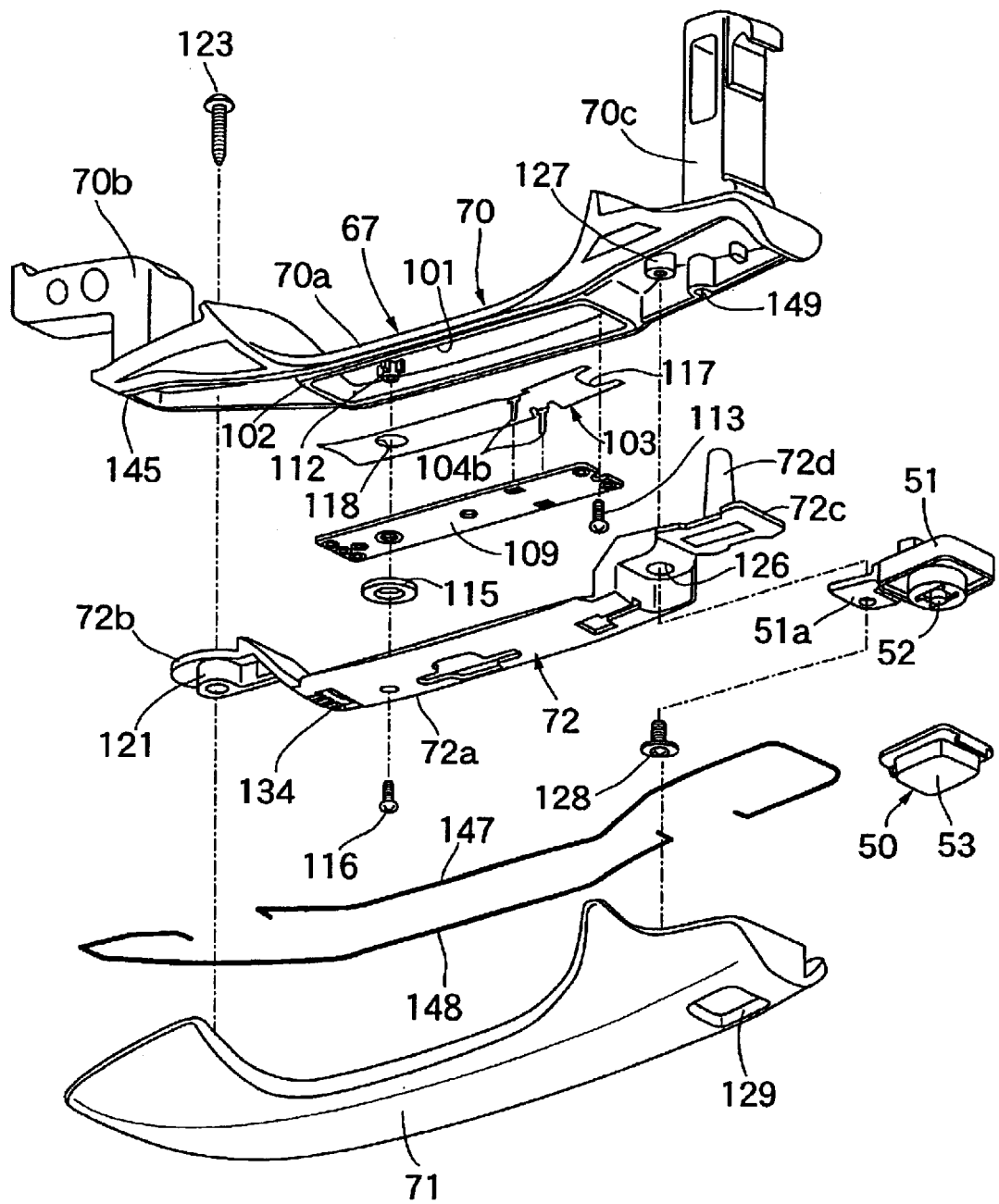
FIG. 11 is an exploded perspective view of an operating handle.

Referring to FIG. 11, the operating handle 67 includes a handle main body 70 formed from a hard synthetic resin, a cover 71 formed from a synthetic resin, and a ground plate 72 formed from conductive and rigid metal and disposed between the handle main body 70 and the cover 71. The handle main body 70 extends in the longitudinal direction of the vehicle, and the cover 71 covers the outer side of the handle main body 70.

The handle main body 70 integrally includes a grip section 70a, a support arm section 70b, and a guide arm section 70c. The grip section 70a has a substantially U-shaped cross section opening upward and extends in the longitudinal direction of the vehicle. The support arm section 70b is integrally provided at one end of the grip section 70a and the guide arm section 70c is integrally provided at the other end thereof.

Provided in the outer panel 66 is a curved section 66a that protrudes inwardly to form a recess 63 that allows for the hand of a user to be inserted between the grip section 70a and the outer panel 66. Also provided in the outer panel 66 are first and second mounting seats 73 and 74 at positions on opposite sides of the curved section 66a in the longitudinal direction of the vehicle. The first and second mounting seats 73 and 74 are slightly recessed and correspond to opposite ends of the operating handle 67.

Figure 12:
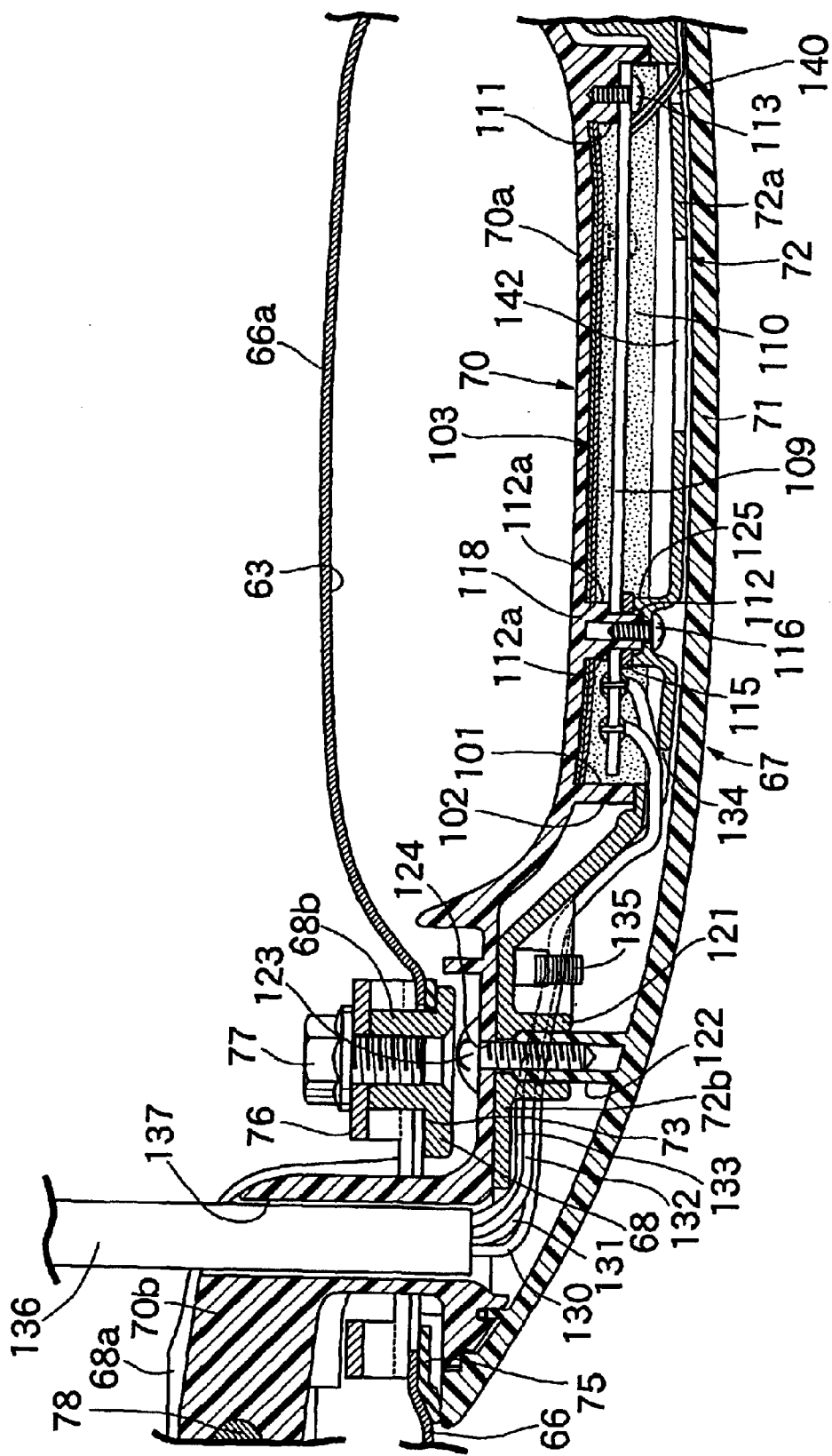
FIG. 12 is a magnified cross section of one end half of the operating handle.

Referring to FIG. 12, a first sheet member 75 made of a synthetic resin is disposed between the first base member 68 and the first mounting seat 73. Integrally provided on the first base member 68 is a handle support section 68a that passes through the first sheet member 75, the outer panel 66, and is inserted into the outer panel 66. A spacer 76 is inserted between the handle support section 68a and the inner surface of the outer panel 66. Also, integrally provided on the first base member 68 is a cylindrical securing boss 68b that runs through the first sheet member 75 and the outer panel 66 and that has an extremity abutting against the spacer 76. By tightening a bolt 77 inserted through the spacer 76 and screwed into the securing boss 68b, the first base member 68 is mounted on the first mounting seat 73 via the first sheet member 75.

The support arm section 70b at the one end of the handle main body 70 passes through the first base member 68, the first sheet member 76, and the outer panel 66, and is inserted into the outer panel 66. The support arm section 70b is swingably supported by the handle support section 70a via a support pin 78. The one end of the handle main body 70, that is, the operating handle 67, is thereby swingably supported in the outer panel 66 via the first base member 68.

Figure 13:
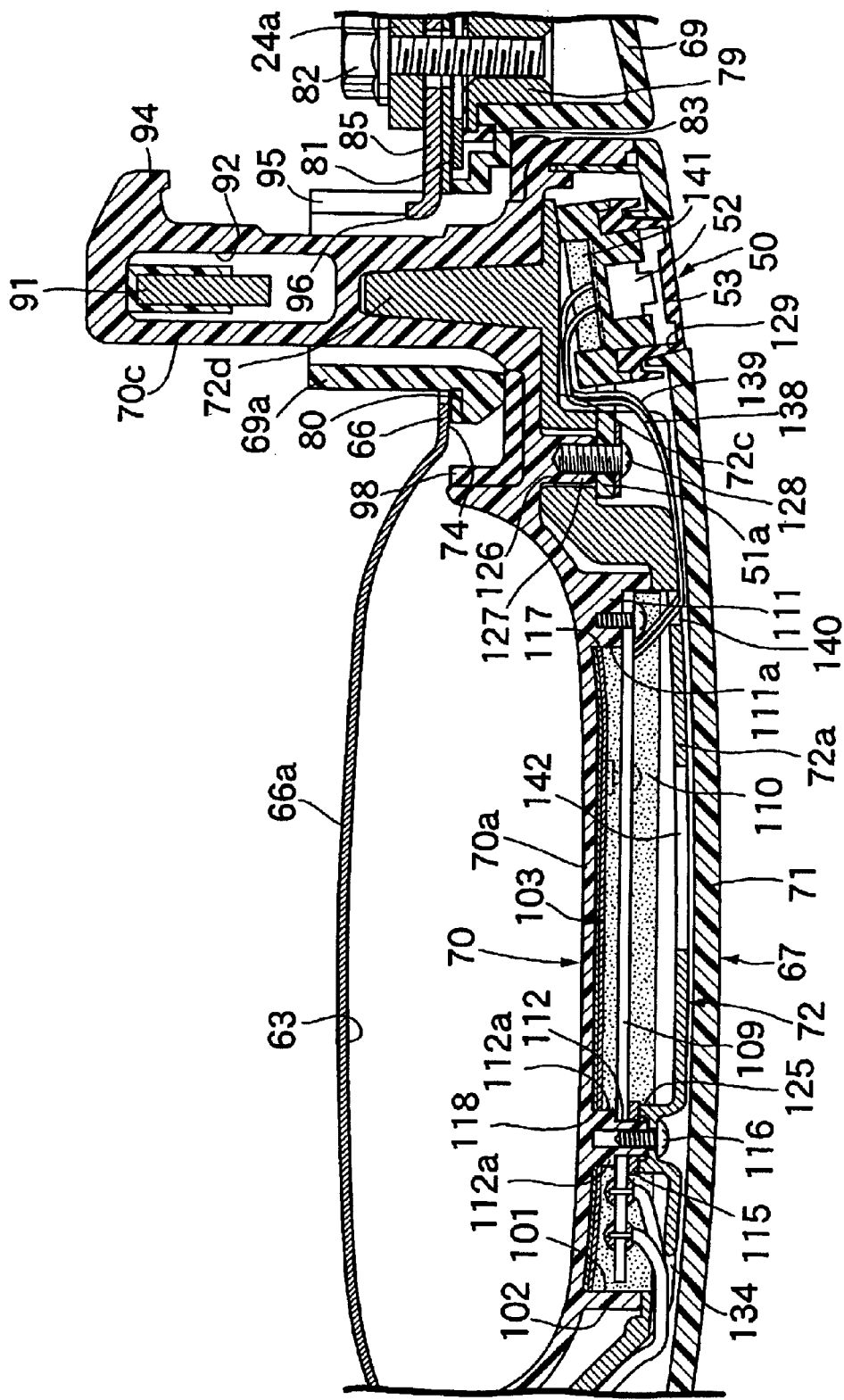
FIG. 13 is a magnified cross section of the other end half of the operating handle.

Referring to FIG. 13, a cylindrical boss 79 is mold-bonded to the second base member 69, which is made of a hard synthetic resin. The second base member 69 is secured to the second mounting seat 74 by a bolt 82 that is screwed into the boss 79 with a reinforcing plate 81 made of a rigid metal and a second sheet member 80 made of a synthetic resin disposed between the second base member 69 and the second mounting seat 74. Furthermore, the second sheet member 80 is disposed between the peripheral section of the second base member 69 and the second mounting seat 74. The reinforcing plate 81 is disposed between the second mounting seat 74 and a cap-shaped sheet member 83 mounted on the boss 79.

The second base member 69 is provided with a key insertion hole 84 for operation by inserting a key (not illustrated) into a key cylinder lock 25. A bracket 85 is fixedly provided on a cylinder body 24 of the key cylinder lock 25 having one end facing the key insertion hole 84. The bracket 85 abuts against the inner surface of the outer panel 66. The cylinder body 24 is integrally provided with an arm section 24a and the bracket 85 is interposed between the arm section 24a and the outer panel 66. By tightening a bolt 82 inserted through the arm section 24a, the bracket 85, the outer panel 66, the reinforcing plate 81, and the sheet member 83, and screwed into the boss 79, the cylinder body 24 of the key cylinder lock 25 is fixed to the second base member 69 with the outer panel 66 and the reinforcing plate 81 disposed therebetween. A mounting arm 81a, which runs through the outer panel 66 and extends inwardly, is integrally provided on the reinforcing plate 81. The bracket 85 is secured to the mounting arm 81a by a screw 86.

Figure 14:
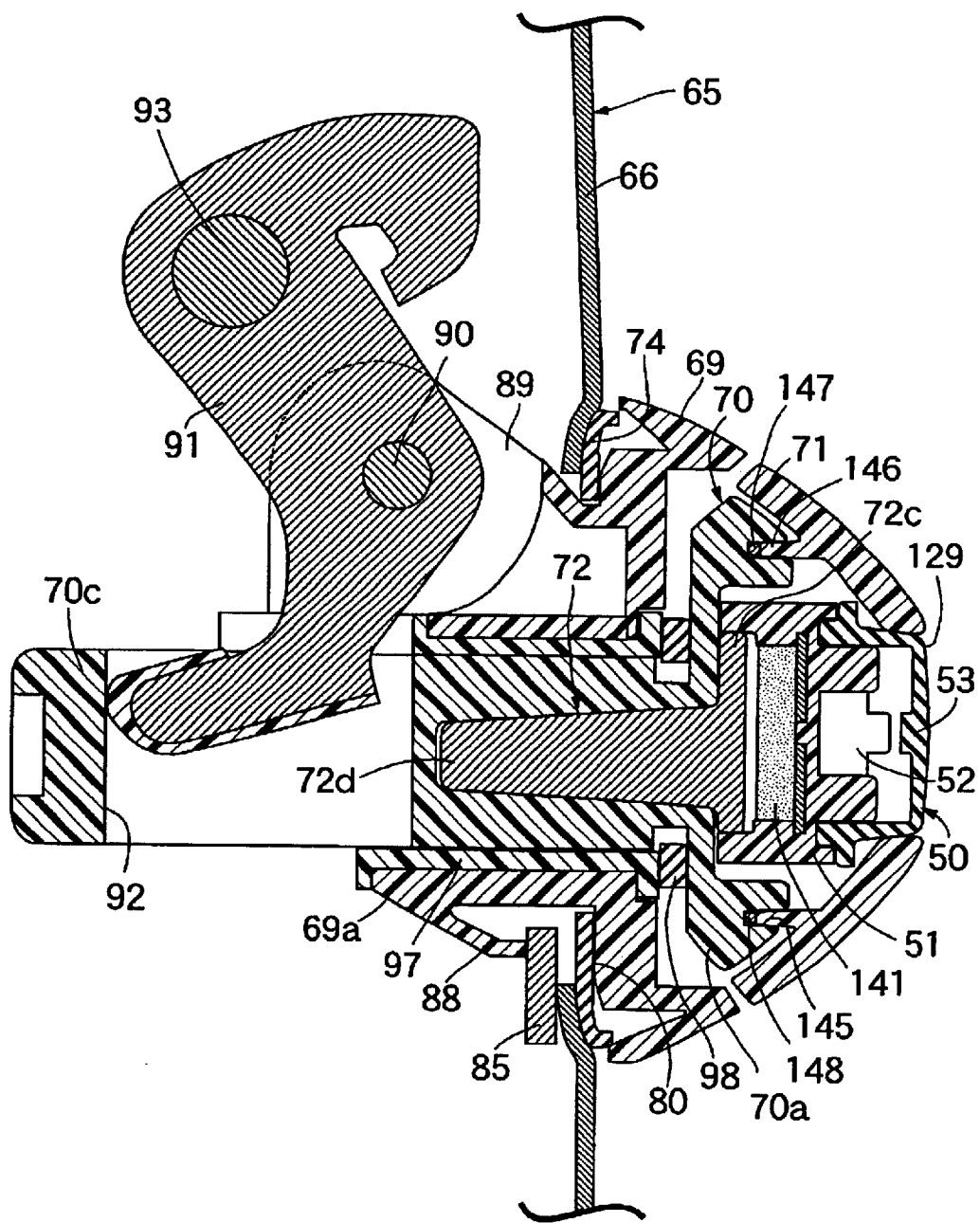
FIG. 14 is a magnified cross section along line XIV—XIV in FIG. 9.

Referring to FIG. 14, a guide tube section 69a, which runs through the outer panel 66 and projects into the outer panel 66, is integrally provided on the second base member 69. The guide tube section 69a is integrally provided with an engagement latch 88 for temporarily retaining the bracket 85 resiliently interposed between the engagement latch 88 and the inner surface of the outer panel 66.

The guide arm section 70c at the other end of the operating handle 67 is movably inserted into the guide tube section 69a. A bellcrank 91 is swingably supported on the support section 89 provided integrally on the guide tube section 69a via a pin 90 which is orthogonal to the axis around which the operating handle 67 swings and extends in the longitudinal direction of the vehicle. One end of the bellcrank 91 engages an engagement hole 92 provided in the guide arm section 70c. That is, the operating handle 67 is linked to the bellcrank 91.

The other end of the bellcrank 91 is linked to one end of a rod 93 and the other end of the rod 93 is linked to a latch mechanism (not illustrated). When the key cylinder lock 25 is in an unlocked state, the bellcrank 91 is in the non-operational position shown in FIG. 14 if the operating handle 67 is not being operated. At this time, the latch mechanism maintains the side door 65 in a closed state. When the bellcrank 91 swings from the position of FIG. 14 to an operational position as a result of action of the guide arm section 70c due to operation of the operating handle 67, the latch mechanism releases the closed state of the side door 65. Thus, the side door 65 is able to be opened by operation of the operating handle 67.

A torsion spring (not illustrated) is provided between the bellcrank 91 and the guide tube section 69a. The bellcrank 91 is biased toward the non-operational position by the spring force of the torsion spring, thereby spring-biasing the operating handle 67 toward a closed position.

A stopper 94 is provided integrally on the extremity of the guide arm section 70c. Provided in the guide tube section 69a is a notch 95 allowing movement of the stopper 94 accompanying action of the guide arm section 70c. Positioned in the notch 95 is a restricting part 96 provided on the bracket 85. The amount by which the operating handle 67 swings in the door-opening direction is restricted by the stopper 94 making contact with the restricting part 96 of the bracket 85.

In order for the guide arm section 70c to move smoothly within the guide tube section 69a, the guide tube section 69a is provided with a sliding member 97 made of a synthetic resin having a low coefficient of friction, such as, for example, nylon, so that the sliding member 97 is in contact with opposite sides of the guide arm sections 70c. A base end section of the guide arm section 70c is provided with a ring-shaped resilient member 98 disposed between the grip section 70a and the second base member 69.

Figure 15:
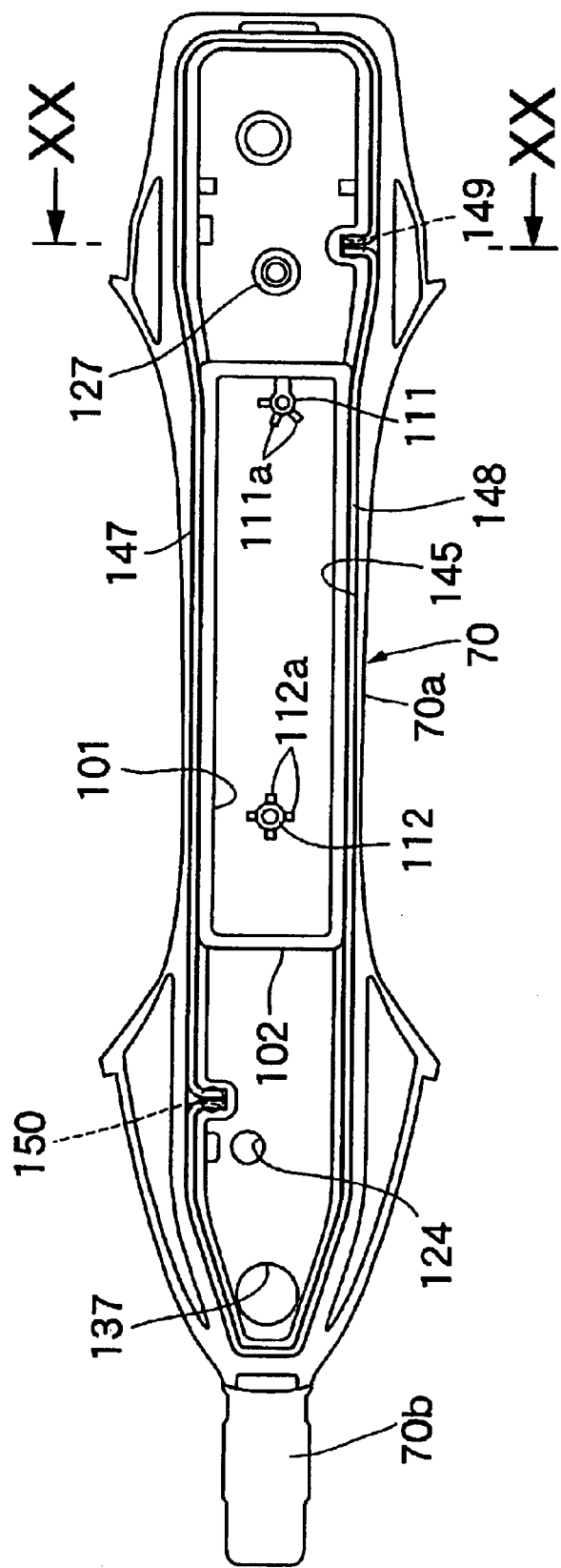
FIG. 15 is a front view of a handle main body in a state in which weld wires are fitted.
Figure 16:
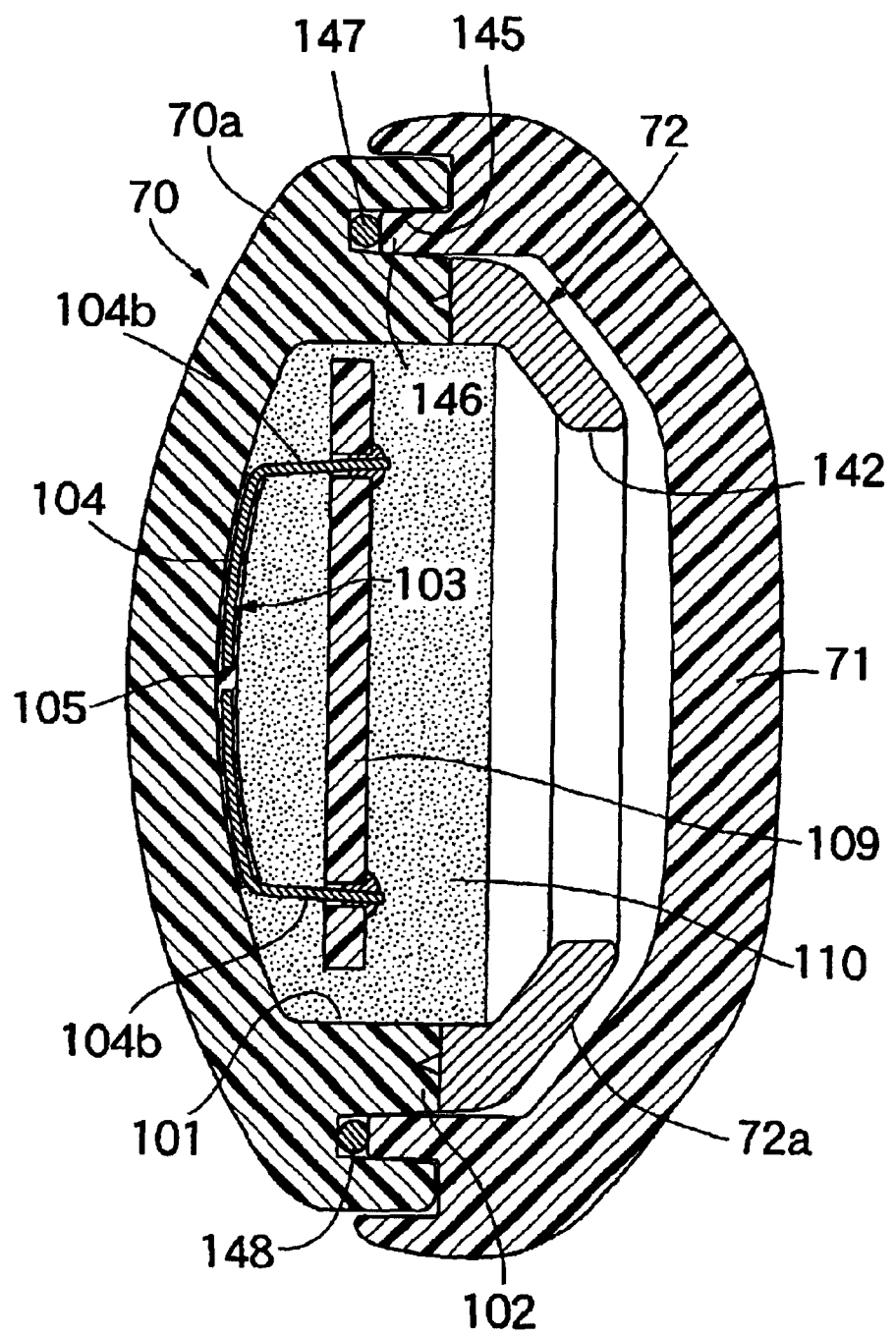
FIG. 16 is a magnified cross section along line XVI—XVI in FIG. 9.

Referring to FIGS. 15 and 16, provided integrally on a middle section, along the longitudinal direction of the vehicle, of the grip section 70a of the handle main body 70 is a rectangular wall 102 projecting toward the cover 71 so as to form a rectangular recess 101 opening toward the cover 71.

Fixedly housed within the recess 101 are an electrode unit 103 and a base plate 109 so that the electrode unit 103 is covered with the base plate 109. The recess 101 is filled with a potting material 110 so as to embed the electrode unit 103 and the base plate 109.

Figure 17:
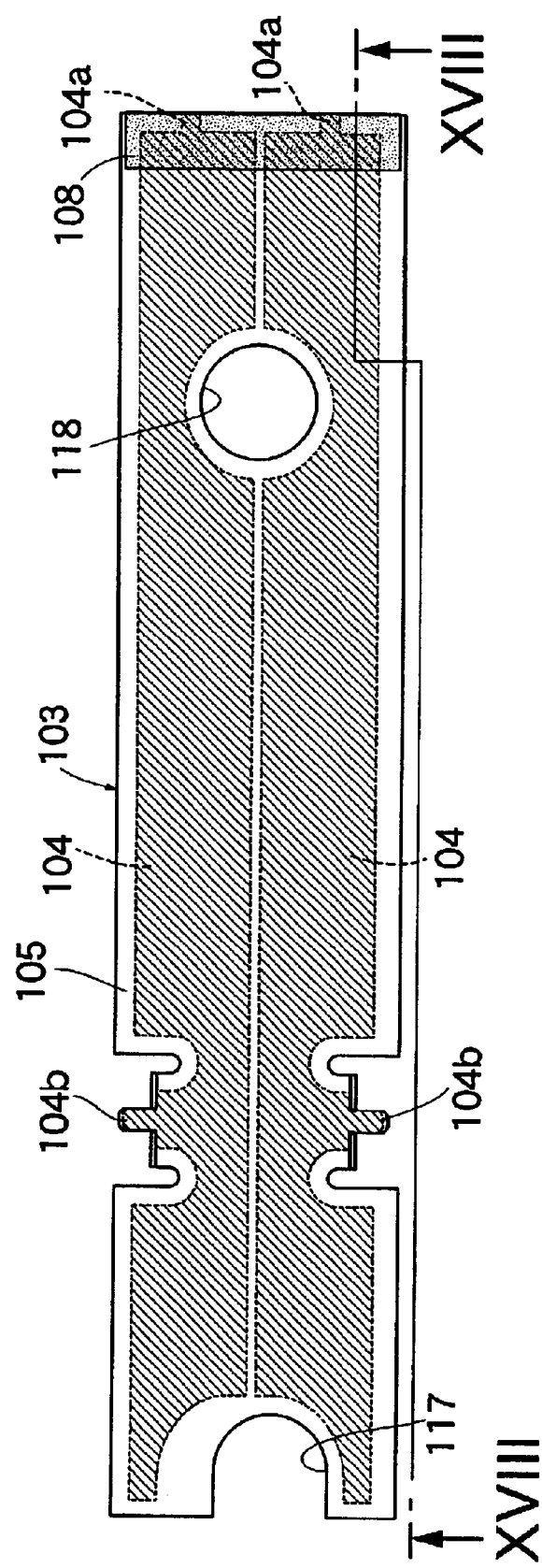
FIG. 17 is a front view of an electrode unit.
Figure 18:
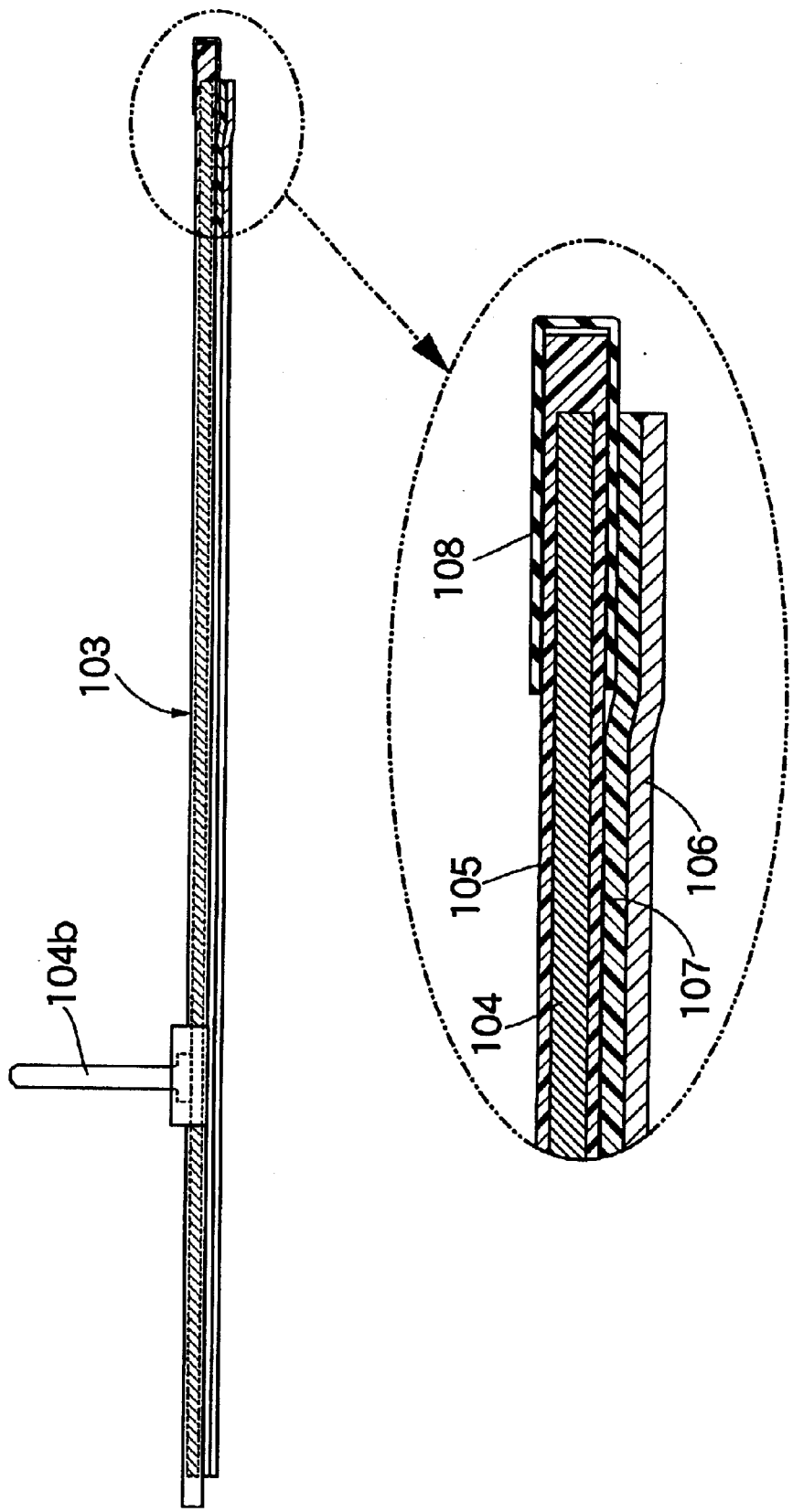
FIG. 18 is a cross section along line XVIII—XVIII in FIG. 17.
Figure 19:
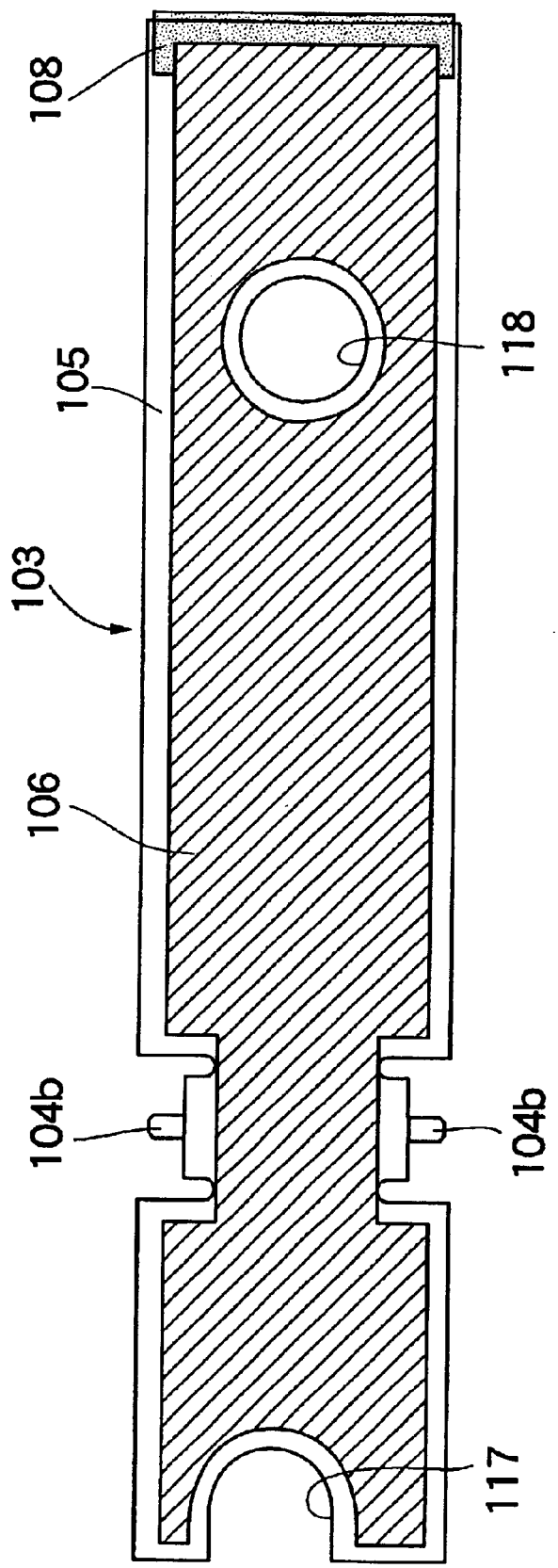
FIG. 19 is a rear view of the electrode unit.

As shown in FIGS. 17 to 19, the electrode unit 103 is formed by integrally coating a pair of flat, plate-like parallel electrodes 104 with an insulator 105 made of a synthetic resin, and a double-sided adhesive tape 107 covered with a release paper 106 is bonded to the reverse surface of the electrode unit 103. One end of the insulator 105 is covered with an insulating tape 108 for preventing the extremities of projections 104a provided integrally with the respective electrodes 104 from being exposed on the outside.

The electrode unit 103 is bonded to the bottom of the recess 101 by the double-sided adhesive tape after removing the release paper 106. Moreover, both electrodes 104 integrally include connecting terminals 104b projecting from the insulator 105 toward the base plate 109. The two connecting terminals 104b are inserted through the base plate 109 that is housed within the recess 101 so as to cover the electrode unit 103.

The detection circuit 34 shown in FIG. 8 is provided on the base plate 109, and the two connecting terminals 104b of the electrodes 104 are inserted through the base plate 109 and connected to the rectifier 43 and the oscillator 38 of the detection circuit 34.

In order for the base plate 109 to be fixedly housed within the recess 101, first and second bosses 111, 112 are integrally and projectingly provided on the grip section 70a of the handle main body 70.

The first boss 111 has a plurality of receiving sections 111a extending radially so as to receive the base plate 109.

The first boss 111 is configured to be integrally connected to the inner surface of the wall 102 in a section close to the guide arm section 70c. The base plate 109 is secured to the first boss 111 by a screw 113.

The second boss 112 is made in the form of cylinder having, on a base end, a plurality of receiving sections 112a extending radially so as to receive the base plate 109. The second boss 112 is integrally and projectingly formed on the grip section 70a in a section close to the support arm section 70b within the recess 101.

Secured to this second boss 112, by a screw 116, are the ground plate 72, the base plate 109, and a washer 115 disposed between the ground plate 72 and the base plate 109. The washer 115 is made of a conductive metal in the form of a ring, and the ground plate 72 is electrically connected to a ground pattern on the base plate 109.

The electrode unit 103 is provided with a semicircular notch 117 for the first boss 111 to be placed in, and an insertion hole 118 for the base of the second boss 112 to be inserted through.

The ground plate 72 includes a case section 72a covering the recess 101, a first support plate section 72b integrally connected to the case section 72a so as to abut against said one end of the grip section 70a of the handle main body 70, a second support plate section 72c integrally connected to the case section 72a so as to abut against said other end of the grip section 70a, and a rod-shaped post section 72d integrally connected to the second support plate section 72c so that a part of the post section 72d projects within the guide arm section 70c of the handle main body 70.

Integrally and projectingly provided on the first support plate section 72b is a cylindrical boss 121 into which a cylindrical boss 122 projectingly provided on the cover 71 is fitted so that the extremity of the boss 122 abuts against the first support plate section 72b. An insertion hole 124 is provided in the one end of the grip section 70a of the handle main body 70 so as to correspond to the bosses 121, 122. A screw 123, which is inserted through the boss 121 via the insertion hole 124, is screwed into the boss 122 of the cover 71.

Projectingly provided on the case section 72a is a cylindrical boss 125 with the washer 115 interposed between the cylindrical boss 125 and the base plate 109. The screw 116 inserted through the boss 125 is screwed into the second boss 112 of the handle main body 70.

An intention-to-lock recognition means 50 that recognizes a vehicle user's intention to lock the door is provided at the other end of the grip 70a of the handle main body 70.

The intention-to-lock recognition means 50 includes a switch holder 51, a tactile switch 52 held by the switch holder 51, and a push button 53 made of an elastomer and mounted on the switch holder 51 so as to be in contact with the tactile switch 52.

A flange 51a of the switch holder 51 is secured to the grip section 70a. The flange 51a is also secured, by a screw 128, to a boss 127 projectingly provided on the grip section 70a so that the boss 127 is inserted through hole 126 provided in the second support plate section 72c of the ground plate 72. The push button 53 is positioned so as to face an opening 129 provided in the cover 71.

Extending from the base plate 109 are a cord 130 connected to a battery (not illustrated), a grounded cord 131, a cord 132 transmitting a signal from the detection circuit 34, and a cord 133 transmitting a signal from the tactile switch 52 of the intention-to-lock recognition means 50. The four cords 130 to 133 extend outside the ground plate 72 via a through hole 134 provided at the first support plate section 72b end of the case section 72a of the ground plate 72. Moreover, the cords 130 to 133 are held on the ground plate 72 by a band 135 outside the ground plate 72.

The four cords 130 to 133 are inserted together into a synthetic resin tube 136 and guided outside the operating handle 67 via a lead-out hole 137 provided in the support arm section 70b of the handle main body 70.

A pair of conductors 138, 139 provide a connection between the base plate 109 and the tactile switch 52 of the intention-to-lock recognition means 50. The conductors 138, 139 are inserted through a through hole 140 provided at the second support plate section 72c end of the case section 72a of the ground plate 72. Moreover, a potting material 141 fills a part of the switch holder 51 so as to cover a section where the two conductors 138, 139 are connected to the tactile switch 52.

The interior of the recess 101 is filled with the potting material 110 so as to embed the electrode unit 103 and the base plate 109 after the ground plate 72 has been fixed to the handle main body 70 by tightening the screws 116, 128. An opening 142 is provided in a middle section of the case section 72a of the ground plate 72 for filling the recess 101 with the potting material 110.

Figure 20:
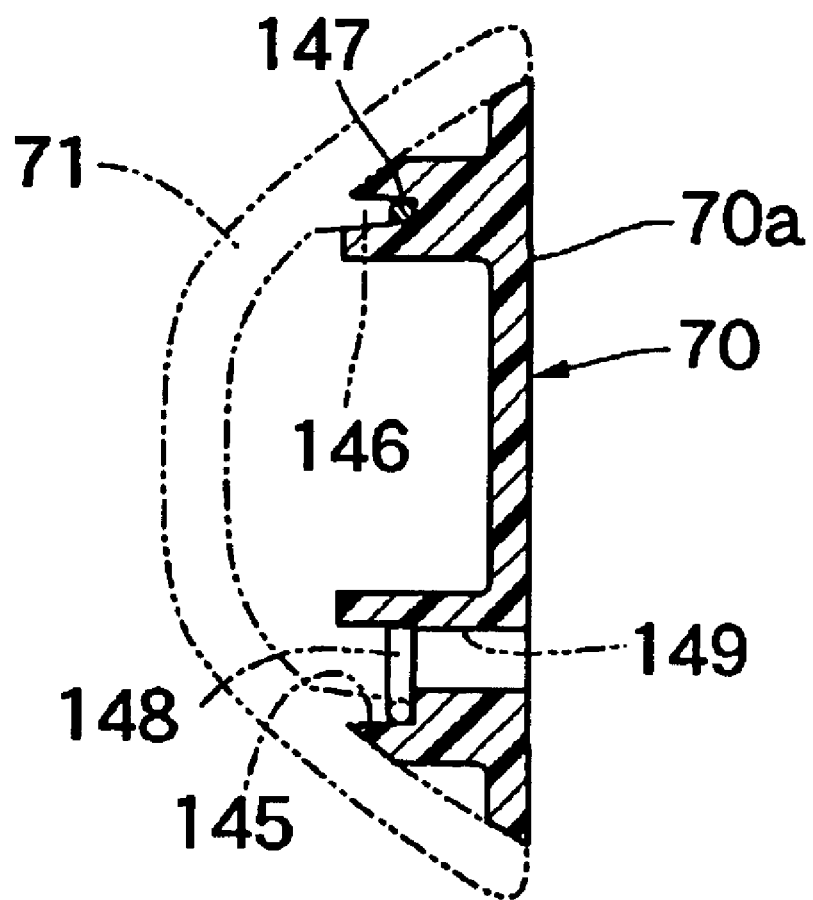
FIG. 20 is a cross section along line XX—XX in FIG. 15.

Referring to FIG. 20, in order to join the cover 71 to the handle main body 70, the grip section 70a of the handle main body 70 is provided with an endless groove 145 on its entire periphery. The cover 71 is provided on the entire periphery of the main body 70 with a projection 146 that fits in the groove 145. The entire inner peripheral surface of the cover 71 encompasses the entire outer peripheral surface of the grip section 70a.

Moreover, a pair of weld wires 147, 148 are inserted into the groove 145 so as to be interposed between the projection 146 and the grip section 70a. Electrode insertion holes 149, 150 in communication with the groove 145 are provided in the grip section 70a in sections that are in contact with opposite ends of the weld wires 147, 148. A supply of electric power to the pair of electrodes inserted in the electrode insertion holes 149, 150 and in contact with opposite ends of the weld wires 147, 148 causes the weld wires to generate heat, thereby melt-bonding the handle main body 70 and the cover 71 on their entire peripheries.

Accordingly, the pair of electrodes 104 are disposed within the operating handle 67 positioned on the outer side of the door 65. The detection circuit 34 that detects a change in capacitance between the two electrodes 104 is connected to the two electrodes 104. Therefore, when a vehicle user touches the operating handle 67 with an intention to unlock the door 65, the capacitance between the two electrodes 104 changes, and the detection circuit 34 detects the change in capacitance, thereby accurately recognizing the vehicle user's intention to unlock the door.

Furthermore, the operating handle 67 includes the handle main body 70 made of a synthetic resin, the cover 71 made of a synthetic resin that covers the outer side of the handle main body 70, the pair of electrodes 104, and the base plate 109 provided with the detection circuit 34 being fixedly housed within the recess 101 formed in the handle main body 70 so that the base plate 109 covers the two electrodes 104. The interior of the recess 101 is filled with the potting material 110 so as to embed the two electrodes 104 and the base plate 109. Therefore, the pair of electrodes 104 and the base plate 109 provided with the detection circuit 34 are easily assembled within the operating handle 67, thereby enhancing the water resistance of the base plate 109 and the two electrodes 104.

Moreover, since the operating handle 67 includes the handle main body 70, the cover 71, and the rigid metal ground plate 72 disposed between the handle main body 70 and the cover 71 and fixed to the handle main body 70, the rigidity of the operating handle 67 is enhanced by the ground plate 72. Moreover, since the ground plate 72 is fixed to the handle main body 70 so as to cover the recess 101, that is, to cover the two electrodes 104 from the cover 71 side, it is possible to prevent the detection circuit 34 from detecting a change in capacitance between the two electrodes 104 as a result of merely touching the surface of the cover 71. Accordingly, the vehicle user's intention to unlock the door is not recognized as a result of merely touching the surface of the cover 71, thereby preventing malfunction and tampering.

Furthermore, since the electrode unit 103 is formed from the pair of flat, plate-like electrodes 104 and the insulator 105 integrally covering these electrodes 104, it is easy to handle the pair of electrodes 104 as a compact unit.

As described above, in accordance with the first aspect of the present invention, the vehicle user's intention to unlock or lock the door can be accurately recognized.

Furthermore, in accordance with the second aspect of the present invention, the detection circuit can be protected by installing it within the metal frame, which is a strength maintaining member for the operating handle.

In accordance with the third aspect of the present invention, since the frame is used as one of the electrodes, the number of parts can be reduced and, moreover, the other electrode can be easily installed.

In accordance with the fourth aspect of the present invention, the pair of electrodes and the base plate provided with the detection circuit can be easily assembled within the operating handle, and moreover the water resistance of the base plate and the two electrodes can be enhanced.

In accordance with the fifth aspect of the present invention, it is possible to enhance the rigidity of the operating handle by the ground plate while preventing malfunction and tampering.

In accordance with the sixth aspect of the present invention, the pair of electrodes can be easily handled as a compact unit.

In accordance with the seventh aspect of the present invention, it is possible to enhance the rigidity of the operating handle by the ground plate while preventing malfunction and tampering.

Embodiments of the present invention are explained above, but the present invention is in no way limited by the embodiments above and can be modified in a variety of ways without departing from the spirit and scope of the present invention described in the attached claims.

For example, in the embodiments above, the present invention is employed as a system for recognizing a vehicle user's intention to unlock the door, but the system of the present invention can be used for recognizing a vehicle user's intention to lock the door.

We claim:

1. A vehicle door handle system comprising:
   an operating handle disposed on an outer side surface of a vehicle door along a longitudinal direction of the vehicle;
   a pair of electrodes disposed, in their entirety, within the operating handle; and
   a detection circuit that detects a change in capacitance between the two electrodes, the detection circuit being connected to the two electrodes.

2. The vehicle door handle system according to claim 1, wherein the operating handle comprises:
   a handle main body made of a synthetic resin;
   a cover made of a synthetic resin and covering an outer side surface of the handle main body; and
   a metal frame fixedly housed between the handle main body and the cover, wherein the detection circuit is installed within the frame.

3. The vehicle door handle system according to claim 2, wherein the frame is an electrode of the pair of electrodes, and wherein the other electrode is covered with an insulating coating and is affixed to the frame.

4. The vehicle door handle system according to claim 1, wherein the operating handle comprises:
   a handle main body made of a synthetic resin; and
   a cover made of a synthetic resin and covering an outer side surface of the handle main body;
   wherein the pair of electrodes and a base plate upon which is provided the detection circuit are fixedly housed within a recess formed in the handle main body, wherein the pair of electrodes are covered with the base plate, and
   wherein an interior of the recess is filled with a potting material to embed the pair of electrodes and the base plate.

5. The vehicle door handle system according to claim 4, further comprising:
   a rigid metal ground plate fixed to the handle main body and covering the recess, the ground plate being disposed between the cover and the handle main body.

6. The vehicle door handle system according to either one of claim 4 or claim 5, wherein the pair of electrodes are integrally covered with an insulator, and wherein each electrode is a flat plate.

7. The vehicle door handle system according to claim 1, wherein the operating handle comprises:
   a handle main body made of a synthetic resin;
   a cover made of a synthetic resin and covering an outer side surface of the handle main body; and
   a rigid metal ground plate disposed between the cover and the handle main body and fixed to the handle main body, wherein the rigid metal ground plate covers the pair of electrodes from a side of the cover.

8. A vehicle door handle system comprising:
   an operating handle disposed on an outer side surface of a vehicle door along a longitudinal direction of the vehicle;
   a pair of electrodes disposed within the operating handle; and
   a detection circuit that detects a change in capacitance between the two electrodes, the detection circuit being connected to the two electrodes,
   wherein the operating handle comprises:
     a handle main body made of a synthetic resin;
     a cover made of a synthetic resin and covering an outer side surface of the handle main body; and
     a metal frame fixedly housed between the handle main body and the cover, wherein the detection circuit is installed within the frame,
   wherein the frame is an electrode of the pair of electrodes, and wherein the other electrode is covered with an insulating coating and is affixed to the frame.

9. The vehicle door handle system according to claim 8, wherein the pair of electrodes and a base plate upon which is provided the detection circuit are fixedly housed within a recess formed in the handle main body, wherein the pair of electrodes are covered with the base plate, and wherein an interior of the recess is filled with a potting material to embed the pair of electrodes and the base plate.

10. The vehicle door handle system according to claim 9, further comprising:
    a rigid metal ground plate fixed to the handle main body and covering the recess, the ground plate being disposed between the cover and the handle main body.

11. The vehicle door handle system according to either one of claim 9 or claim 10, wherein the pair of electrodes are integrally covered with an insulator, and wherein each electrode is a flat plate.

12. The vehicle door handle system according to claim 8, wherein the operating handle further comprises:
    a rigid metal ground plate disposed between the cover and the handle main body and fixed to the handle main body, wherein the rigid metal ground plate covers the pair of electrodes from a side of the cover.

13. A vehicle door handle system comprising:
    an operating handle disposed on an outer side surface of a vehicle door along a longitudinal direction of the vehicle;
    a pair of electrodes disposed within the operating handle; and
    a detection circuit that detects a change in capacitance between the two electrodes, the detection circuit being connected to the two electrodes,
    wherein the operating handle comprises:
        a handle main body made of a synthetic resin; and
        a cover made of a synthetic resin and covering an outer side surface of the handle main body;
    wherein the pair of electrodes and a base plate upon which is provided the detection circuit are fixedly housed within a recess formed in the handle main body, wherein the pair of electrodes are covered with the base plate, and
    wherein an interior of the recess is filled with a potting material to embed the pair of electrodes and the base plate.

14. The vehicle door handle system according to claim 13, wherein the operating handle comprises:
    a metal frame fixedly housed between the handle main body and the cover, wherein the detection circuit is installed within the frame.

15. The vehicle door handle system according to claim 13, further comprising:
    a rigid metal ground plate fixed to the handle main body and covering the recess, the ground plate being disposed between the cover and the handle main body.

16. The vehicle door handle system according to either one of claim 13 or claim 14, wherein the pair of electrodes are integrally covered with an insulator, and wherein each electrode is a fiat plate.

17. The vehicle door handle system according to claim 13, wherein the operating handle comprises:
    a rigid metal ground plate disposed between the cover and the handle main body and fixed to the handle main body, wherein the rigid metal ground plate covers the pair of electrodes from a side of the cover.

* * * * *